(12) United States Patent
Lee et al.

(10) Patent No.: US 6,833,319 B2
(45) Date of Patent: Dec. 21, 2004

(54) METHOD FOR FABRICATING SEMICONDUCTOR DEVICE

(75) Inventors: Sung-Kwon Lee, Ichon-shi (KR); Sang-Ik Kim, Ichon-shi (KR)

(73) Assignee: Hynix Semiconductor Inc., Kyoungku-do (KR)

( * ) Notice: Subject to any disclaimer, the term of this patent is extended or adjusted under 35 U.S.C. 154(b) by 0 days.

(21) Appl. No.: 10/293,498

(22) Filed: Nov. 14, 2002

(65) Prior Publication Data

US 2003/0119225 A1 Jun. 26, 2003

(30) Foreign Application Priority Data

Dec. 19, 2001 (KR) .................................... 2001-0081287

(51) Int. Cl.[7] .......................................... H01L 21/4763
(52) U.S. Cl. ...................... 438/637; 438/622; 438/623; 438/624; 438/636; 438/637
(58) Field of Search ................................ 438/638, 637, 438/636, 624, 622, 623

(56) References Cited

U.S. PATENT DOCUMENTS 5,994,755 A * 11/1999 DeJong et al. .............. 257/500
6,171,982 B1 * 1/2001 Sato ........................... 438/795

* cited by examiner

*Primary Examiner*—Long Pham
(74) *Attorney, Agent, or Firm*—Birch, Stewart, Kolasch & Birch, LLP

(57) ABSTRACT

A method for fabricating a semiconductor device by simultaneously forming via holes in a multi-layered structure having depth differences without requiring additional process steps. Steps to achieve this effect include forming a first conductive layer; forming a first etching protection layer on the first conductive layer; forming a first insulating layer; forming a second conductive layer on the first insulating layer; forming a second etching protection layer on the second conductive layer, wherein etching protection efficiency of the second protection layer is higher than that of the first etching protection layer; forming a second insulating layer; and forming a first and a second via hole respectively exposing the first and the second conductive layer by selectively etching the first and second insulating layer.

20 Claims, 3 Drawing Sheets

METHOD FOR FABRICATING SEMICONDUCTOR DEVICE

FIELD OF THE INVENTION

The present invention relates to a method for fabricating a semiconductor device; and, more particularly, to a method for forming via holes having different depths by conductive layers constructed in a multi-layered stacking structure.

DESCRIPTION OF RELATED ARTS

Generally, determination of the size of an integrated circuit (IC) chip, with use of a device in which the size is less than the sub-microns, depends on a layout rule that enables the manufacturing process. Also, the pitch of a metal for wiring between devices generally determines the IC chip size.

A multi-layered metal wiring technique is one proposed approach for solving the above-described limitation in the determination of the IC chip size by providing flexibility of the layout and augmenting the degree of integration while reducing the area of a chip. Ultimately, with this developed technique, it is possible to attain a device with multi-functions and high integration.

In addition to metal wiring, other conductive layers such as bit lines, word lines, storage nodes and so forth are also vertically arrayed in a multi-layer structure.

Figure 1A:
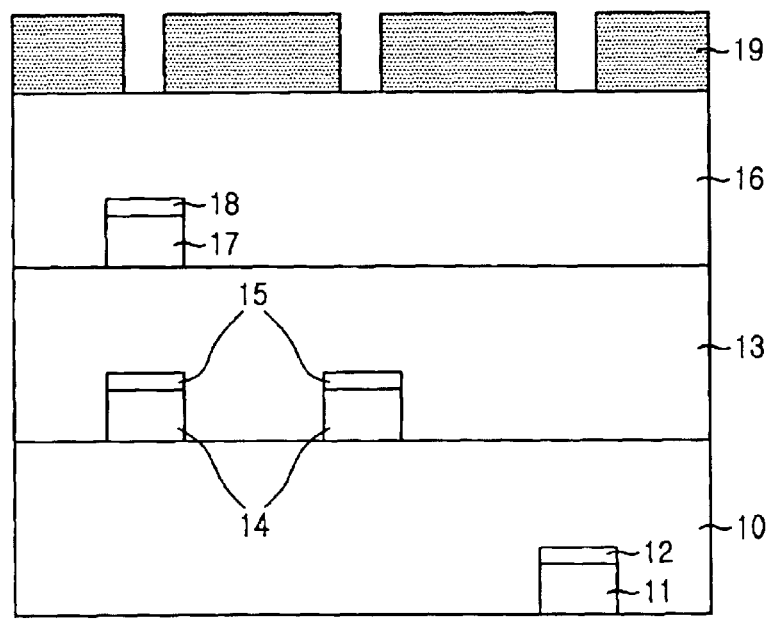
Figure 1B:
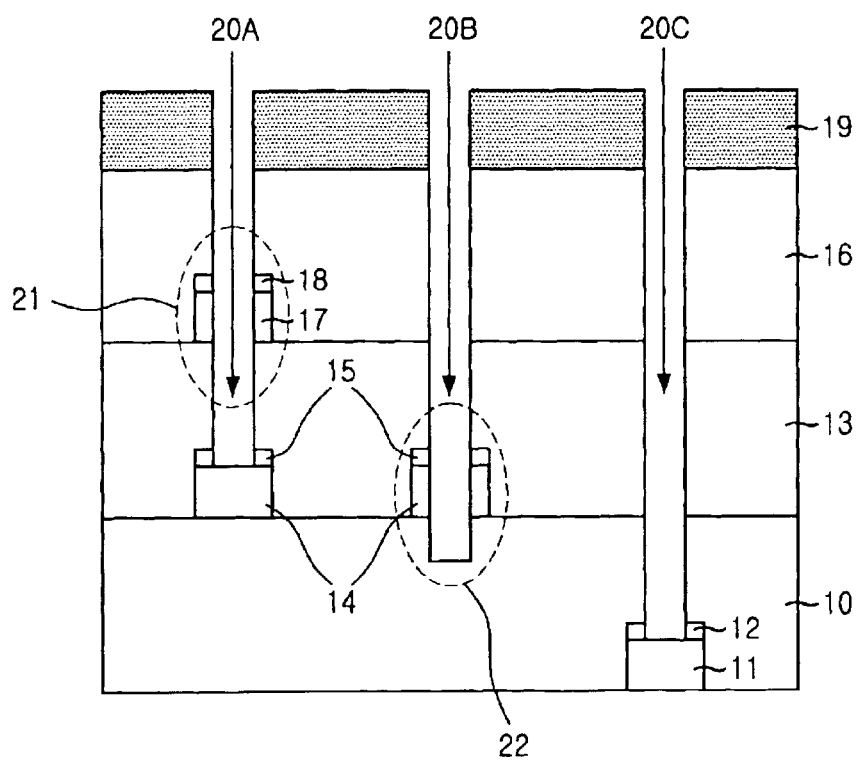

FIGS. 1A and 1B are cross-sectional views illustrating a process for forming via holes allocated at layers having substantially different thicknesses in accordance with the prior art and a further explanation will be provided with reference to FIGS. 1A and 1B.

A first conductive layer 11 is formed on a substrate board (not shown) and a first antireflection layer 12 is formed thereon. A first insulating layer 10 is formed on the first conductive layer 11 and the first antireflection layer 12, and a planarization process is applied to the first insulating layer 10. Formation of a second conductive layer 14, a second antireflection layer 15 and a second insulating layer 13 on top of the first insulating layer 10, which is, in turn, followed by another subsequent formation of a third conductive layer 17, a third antireflection layer 18 and a third insulating layer 16 thereon. The first to the third antireflection layers 12, 15 and 18 are designated for preventing irregular reflections, which occur due to photo exposure during a photo-etching process for forming each pattern with the first to the third conductive layers 11, 14 and 17, and the thickness of each antireflection layer 12, 15 and 18 is generally uniform. This constructional scheme represents a multi-layered metal wiring, and one mask is used to make contacts for connecting multi-layered wiring structures for the purpose of simplifying a manufacturing process. That is, as shown in FIGS. 1A and 1B, via holes are formed with one photoresist pattern 19 formed by an exposure process with one mask.

Next, referred to FIG. 1B, the photoresist pattern 19 acts as an etch mask in order to form via holes 20A, 20B and 20C exposing the first to the third conductive layers 11, 14 and 17.

Meanwhile, via holes formed simultaneously through a photo etching process have different depths, because the thickness of the etch target to each conductive layer 11, 14 and 17 is different. Moreover, it is, therefore, inevitable that the conductive layers 14 and 17 are excessively etched in the case where the third via hole 20C which has a depth which is relatively large compared to the other two via holes, because the etch target is determined by the condition for forming the via hole 20C. Reference numerals 21 and 22 in FIG. 1B represent the loss of the conductive layers 17 and 14.

On the other hand, in case where the etch target is determined by the upper conductive layer 17 or 14 in the etching process to prevent a loss of the top conductive layers due to excessive etching, there results in a bad contact at the bottom conductive layer 11.

SUMMARY OF THE INVENTION

It is, therefore, an object of the present invention to provide a method for fabricating a semiconductor device that is capable of obtaining a proper process margin during the process for forming via holes in a multi-layered stacking structure having different depths without requiring additional process steps.

In accordance with one aspect of the present invention, there is provided a method for fabricating a semiconductor device, including the steps of: forming a first conductive layer; forming a first etching protection layer on the first conductive layer; forming a first insulating layer; forming a second conductive layer on the first insulating layer; forming a second etching protection layer on the second conductive layer, wherein the etching protection efficiency of the second protection layer is higher than the first etching protection layer; forming a second insulating layer; and forming first and second via hole respectively exposing the first and the second conductive layer by selectively etching the first and the second insulating layer.

In accordance with another aspect of the present invention, there is provided a method for fabricating a semiconductor device, including the steps of: forming a first conductive layer; patterning the conductive layer with a first antireflection layer formed on the first conductive layer; forming a first insulating layer; forming a second conductive layer on the first insulating layer; patterning the second conductive layer with a second antireflection layer formed on the second conductive layer, wherein a etching-protection efficiency of the second antireflection layer is higher than the first antireflection layer; forming a second insulating layer; and forming a first and a second via hole respectively exposing, the first and the second conductive layer by selectively etching the first and the second insulating layer.

The present invention provides the advantage of preventing degradation of the semiconductor properties that occurs due to an excessive etching of the conductive layer when simultaneously forming the via holes in a multi-layered structure that has significant depth differences by providing variations in the thickness of the antireflection layers allocated on the conductive layers in the multi-layered structure.

BRIEF DESCRIPTION OF THE DRAWING(S)

Figure 2A:
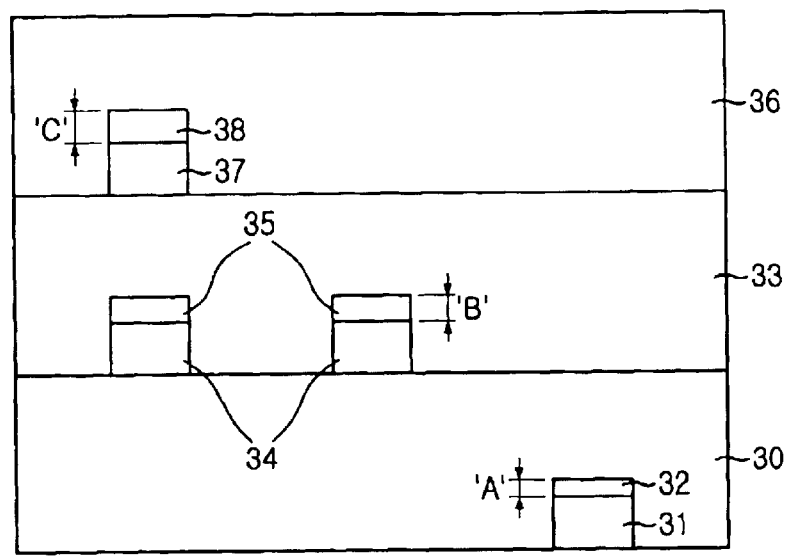
Figure 2B:
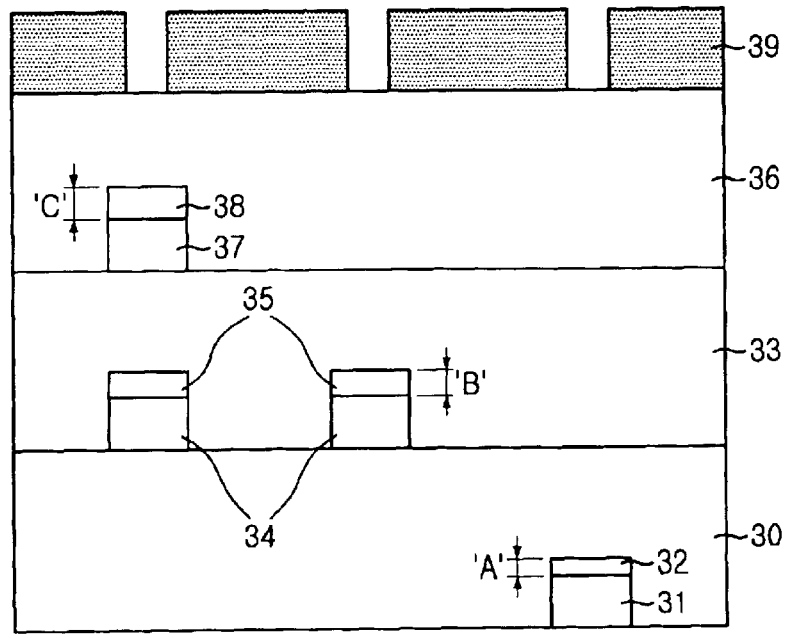
Figure 2C:
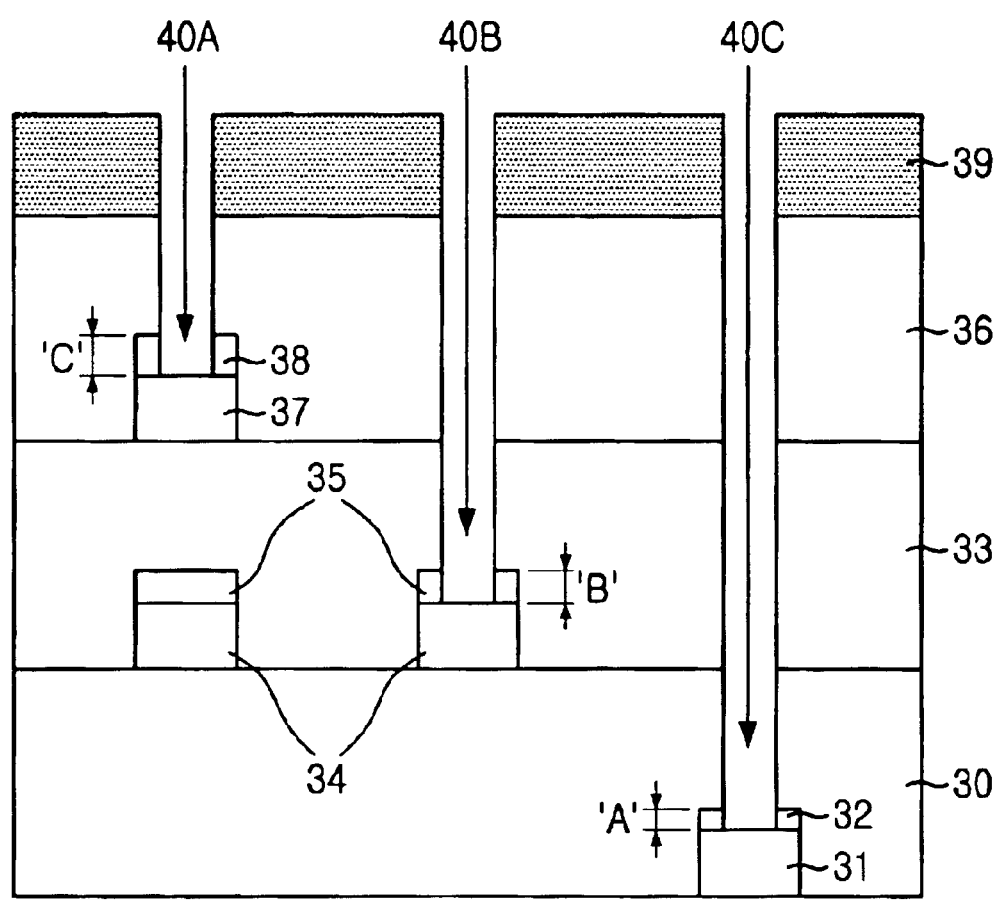

The above and other objects and features of the present invention will become apparent from the following description of the preferred embodiments given in conjunction with the accompanying drawings, in which:

FIGS. 1A and 1B are cross-sectional views illustrating a process for forming via holes that have significant depth differences in accordance with the prior art; and FIGS. 2A to 2C are cross-sectional views depicting a process for fabricating a semiconductor device with a multi-layered structure in accordance with a preferred embodiment of the present invention.

DETAILED DESCRIPTION OF THE INVENTION

FIGS. 2A to 2C are cross-sectional views depicting a process for manufacturing a semiconductor device with a multi-layered structure in accordance with a preferred embodiment of the present invention.

With reference to FIGS. 2A to 2C, the preferred embodiment of the present invention will be described in more detail.

A first conductive layer 31 and a first antireflection layer 32 are formed in a stacking structure on a substrate board (not shown). Herein, the first antireflection layer 32 is used in a photo etching process for patterning the first conductive layer 31 and set to have a thickness in 'A'. Subsequently, a first insulating layer 30 is deposited on top of the first conductive layer 31 and the first antireflection layer 32, and a planarization of the first insulating layer 30 occurs through a chemical mechanical polishing (hereinafter referred as to CMP) process or an etch back process.

Next, a second conductive layer 34 and a second antireflection layer 35 are formed also in a stacking structure on the first insulating layer 30. In this case, the second antireflection layer 35 is used in the photo etching process for patterning the second conductive layer 34 and set to have a thickness 'B'. Then, a second insulating layer 33 is deposited on top of the second conductive layer 34 and the second antireflection layer 35, and the CMP process or the etch back process is proceeded to planarize the second insulating layer 33 thereafter.

Continuous to the above construction of the multi-layers, a third conductive layer 37 and a third antireflection layer 38 are formed also in a stacking structure on the second insulating layer 33. Herein, the third antireflection layer 38 is used in the photo etching process for patterning the third conductive layer 37 and set to have a thickness 'C'. On the third conductive layer 37 and the third antireflection layer 38, a third insulating layer 36 is deposited and then, planarized through the CMP process or the etch back process. Also, the first to the third antireflection layers 32, 35 and 38 are designated for preventing irregular reflections resulting from photo exposures during the photo-etching process, and each antireflection layer is purposely designed to have a thickness 'A', 'B' and 'C', respectively so as to act as a hard-mask for preventing an excessive etching at the upper conductive layers 34 and 37. Although each thickness 'A', 'B' and 'C' varies in accordance with each thickness of the insulating layers 30, 33 and 36, the magnitude of the thickness is arranged as in the order of "C>B>A".

In order to connect multi-layered wiring structures, only one mask is used to form via holes for the purpose of simplifying the fabricating process. As shown in FIG. 2B, an etch-mask pattern 39 for forming via holes is formed on the third insulating layer 36. In the preferred embodiment of the present invention the etch-mask pattern 39 is formed with photoresist. Also, the etch-mask pattern 39 can be formed with a hard mask using polysilicon, SiON or SiN.

Subsequently, an etch process is performed to form the via holes for making contacts with the first to the third conductive layers 31, 34 and 37. FIG. 2C depicts the formed via holes 40A, 40B and 40C for running electric circuits with the third to the first conductive layers 37, 34 and 31, respectively.

Accordingly, when patterning a conductive layer without an additional process for fabricating a hard-mask, each antireflection layer is set to have a different thickness whereby the antireflection layer functions as a hard-mask during the etching process for forming a subsequent via hole formation.

Herein, the first to the third conductive layers 31, 34 and 37 are formed with polysilicon, metal silicide, aluminum Al, tungsten W, thallium nitride TiN and so on. Also, the first to the third antireflection layers 32, 35, and 38 are formed with inorganic substances such as TiN, Ti/TiN, SiON or SiN and so on, whereas the first to the third insulting layers 30, 33 and 36 are formed with a low dielectric material (Low-k) such as a tetra ethyl ortho silicate (TEOS) film deposited by plasma enhanced chemical vapor deposition (PE-CVD), an oxide film deposited by high density plasma (HDP), an advanced planarization layer (APL) film, a boro phospho silicate glass (BPSG) or a TEOS film deposited by low passive CVD (LP-CVD) and so on. The thickness of the conductive layers and an etching selection ratio are taken into consideration when proceeding appropriately in the etching and forming of the via holes.

In the meantime, it is also possible to control the speed of the etching process according to the thickness of each of the antireflection layers. It is still possible to arrange the thickness of each antireflection layer A, B and C to be uniform but the amounts of oxygen contained thereof should be in the order of "A>B>C", because the etch speed is increase in proportion to the amount of oxygen.

As shown hereinabove, the preferred embodiment of the present invention provides the effect of preventing excessive etching of the upper conductive layers, which occurs due to different etching thickness of the insulating layers on each conductive layer, without using additional process steps, by varying the thickness of the antireflection layers used in the photo-etching process for patterning the conductive layers when simultaneously forming via holes with respect to the conductive layers in a multi-layer structure.

Although the preferred embodiment of the present invention describes the formation of the via holes with respect to the conductive layers stacked in three layers, it is possible to apply the present invention to conductive layers stacked in a plurality of layers exceeding three layers.

As described above, when fabricating a semiconductor device with a multi-layered structure, the present invention provides advantages in improving overlapped margins so as to minimize the production of bad semiconductor devices and enhancing repeatability of the process, thereby ultimately increasing the yields of semiconductor devices.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:
   forming a first conductive layer;
   forming a first etching protection layer on the first conductive layer;
   forming a first insulating layer;
   forming a second conductive layer on the first insulating layer;
   forming a second etching protection layer on the second conductive layer, wherein etching protection efficiency of the second protection layer is higher than that of the first etching protection layer;
   forming a second insulating layer; and
   simultaneously forming a first and a second via hole respectively exposing the first and the second conductive layer by selectively etching the first and the second insulating layer.

2. The method as recited in claim 1, wherein the second etching protection layer is thicker than the first etching protection layer.

3. The method as recited in claim 2, wherein the first and the second etching protection layers are antireflection layers.

4. The method as recited in claim 3, wherein each of the first and the second etching protection layers is formed with a member selected from the group consisting of TiN, Ti/TiN, SiON and SiN.

5. The method as recited in claim 1, wherein an amount of oxygen contained in the second etching protection layer is smaller than an amount of oxygen contained in the first protection layer.

6. The method as recited in claim 1, further comprising the step of forming an etch-mask pattern on the second insulating layer after forming the second insulating layer, wherein the etch-mask pattern is formed of a photoresist, polysilicon, SiON or SiN.

7. The method as recited in claim 1, further comprising steps of:

forming a third conductive layer on the second insulating layer;

forming a third etching protection layer on the third conductive layer, wherein etching-protection efficiency of the third etching protection layer is higher than the second protection layer;

forming a third insulating layer; and forming a third via hole exposing the third conductive layer by selectively etching the third insulating layer during the step of forming the first and the second via hole.

8. The method as recited in claim 7, wherein the thickness of the first to third etching protection layers increases in this same order.

9. The method as recited in claim 8, wherein each of the first to the third etching protection layers is formed with at least one member selected from the group consisting of TiN, Ti/TiN, SiON and SiN.

10. The method as recited in claim 7, wherein the amount of oxygen contained in the first to third etching protection layers decreases in this same order.

11. The method as recited in claim 7, further comprising the step of forming an etch-mask pattern on the third insulating layer after forming the third insulating layer, wherein the etch-mask pattern is formed of a photoresist, polysilicon, SiON or SiN.

12. A method for fabricating a semiconductor device, comprising the steps of:

forming a first conductive layer;

patterning the conductive layer with a first antireflection layer formed on the first conductive layer;

forming a first insulating layer;

forming a second conductive layer on the first insulating layer;

patterning the second conductive layer with a second antireflection layer formed on the second conductive layer, wherein the etching-protection efficiency of the second antireflection layer is higher than that of the first antireflection layer;

forming a second insulating layer; and simultaneously forming first and a second via holes, respectively exposing the first and the second conductive layers by selectively etching the first and the second insulating layer.

13. The method as recited in claim 12, wherein the second antireflection layer is thicker than the first antireflection layer.

14. The method as recited in claim 12, wherein each of the first and the second antireflection layers is formed with at least one member selected from the group consisting of TiN, Ti/TiN, SiON and SiN.

15. The method as recited in claim 12, wherein an amount of oxygen contained in the second antireflection layer is smaller than an amount of oxygen contained in the first antireflection layer.

16. The method as recited in claim 12, further comprising the step of forming an etch-mask pattern on the second insulating layer after forming the second insulating layer, wherein the etch-mask pattern is formed of a photoresist, polysilicon, SiON or SiN.

17. The method as recited in claim 12, further comprising the steps of:

forming a third conductive layer on the second insulating layer;

patterning the third conductive layer with a third antireflection layer formed on the third conductive layer, wherein the etching-protection efficiency of the third antireflection layer is higher than that of the second anti-reflection layer;

forming a third insulating layer;

forming an etch-mask pattern on the third insulating layer, wherein the etch-mask pattern is formed of a photoresist, polysilicon, SiON or SiN; and forming a third via hole and exposing the third conductive layer by selectively etching the third insulating layer at the step of forming the first and the second via hole.

18. The method as recited in claim 17, wherein the thickness of the first to third antireflection layer increases in this order.

19. The method as recited in claim 18, wherein each of the first to the third antireflection layers is formed with one member selected from the group consisting of TiN, Ti/TiN, SiON and SiN.

20. The method as recited in claim 12, wherein each amount of oxygen contained in the first to third antireflection layers decreases in this order.

* * * * *